United States Patent [19]

Suyama et al.

[11] Patent Number: 4,720,833
[45] Date of Patent: Jan. 19, 1988

[54] SEMICONDUCTOR LASER APPARATUS

[75] Inventors: Takahiro Suyama, Tenri; Toshiro Hayakawa, Nara; Kohsei Takahashi, Tenri; Saburo Yamamoto, Nara, all of Japan

[73] Assignee: Sharp Kabushiki Kaisha, Osaka, Japan

[21] Appl. No.: 801,868

[22] Filed: Nov. 26, 1985

[30] Foreign Application Priority Data

Nov. 30, 1984 [JP] Japan ................... 59-254577

[51] Int. Cl.$^4$ ................. H01S 3/19; H01L 23/02; H01L 23/12
[52] U.S. Cl. ......................... 372/44; 372/50; 372/48; 357/74
[58] Field of Search ............ 372/50, 44, 48; 357/74

[56] References Cited

U.S. PATENT DOCUMENTS 4,338,577 7/1982 Sato et al. ................. 372/44

FOREIGN PATENT DOCUMENTS 57-177587 11/1982 Japan.
111390 7/1983 Japan ................. 372/44

OTHER PUBLICATIONS

D. E. Ackley, "Single Longitudinal Mode...," *Appl. Phys. Lett.* 42(2), Jan. 15, 1983, pp. 152-154.
D. Botez et al., "High-Power Phase-Locked Arrays...," *Appl. Phys. Lett.* 43(12) Dec. 15, 1983, pp. 1096-1098.
J. C. J. Finck et al., "A Semiconductor Laser for Information Read-Out," *Philips Technical Review*, vol. 39, 1980, No. 2, pp. 37-47.
Scifres et al., "High Power Coupled...," *Appl. Phys. Lett.*, 41 (2), Jul. 15, 1982.
Ackley, "Phase-Locked Injection Laser...," *Electronics Letters*, vol. 20, No. 17, Aug. 16, 1984, pp. 695-697.
Temkin et al., "Schottky Barrier Restricted...," *Appl. Phys. Lett.*, 44 (5), Mar. 1, 1984, pp. 473-475.
Wang et al., "In-Phase Locking...," *Appl. Phys. Lett.*, 48 (26), Jun. 30, 1986, pp. 1770-1772.
Matsumoto et al., "Stable Supermode Operation...," *J. Appl. Phys.*, 58 (7), Oct. 1, 1985, pp. 2783-2785.
Matsumoto et al., "Phase-Locked VSIS Laser...," pp. 13-19, 1985.

Primary Examiner—Eugene R. LaRoche
Assistant Examiner—Michael B. Shingleton
Attorney, Agent, or Firm—Birch, Stewart, Kolasch & Birch

[57] ABSTRACT

A semiconductor laser apparatus comprising: a semiconductor laser array device in which a plurality of laser operation areas are disposed in a parallel manner to attain optical phase coupling therebetween and laser lights are propagated with a 180° phase shift therebetween in the adjacent laser operation areas, resulting in a far-field pattern having a peak in each of the two different directions of the emission of said laser beams therefrom, and a stem containing the semiconductor laser array device therein in such a manner that one of the the laser lights from the semiconductor laser array device is blocked with the inner wall of the stem and the other laser beam passes outside of the stem.

10 Claims, 3 Drawing Figures

SEMICONDUCTOR LASER APPARATUS

BACKGROUND OF THE INVENTION

1. Field of the invention:

This invention relates to a high output power semiconductor laser apparatus containing a semiconductor laser array device therein in which the adjacent laser operation areas are optically coupled with a 180° degrees phase shift therebetween.

2. Description of the prior art:

Semiconductor laser devices which are useful as light sources for information processing apparatus such as optical discs, laser beam printers, etc., have been put into practical use. With an increase in information to be processed, speed is required, and the development of semiconductor devices which can produce the highest possible output power but which can retain stabilized operation characteristics has begun. Even semiconductor laser devices having a single active region, the development of which has been most advanced, can only produce an output power of approximately 50 mW at the maximum value in practical use.

Semiconductor laser arrays (including gain guided laser arrays and index guided laser arrays) have been proposed in which a plurality of laser operation areas are disposed in a parallel manner to attain optical phase coupling therebetween resulting in a laser array device producing great output power with a single phase. However, in conventional gain guided laser arrays, the laser operation areas of which attain a gain-guiding function, phase variation arises in each of the laser operation areas and moreover loss of light increases with a decrease in a gain in the phase coupling region positioned between the adjacent laser operation areas, so that a phase shift of the electric field between the adjacent laser operation areas reaches 180°.

For conventional index guided laser arrays, a CSP-LOC (channeled-substrate planer large-optical-cavity) laser device has been proposed by D. Botez et al., of RCA Laboratories, Fourth International Conference on Integrated Optics and Optical Fiber Communication, Abstract 29B5-2, June 27–30, 1983 Tokyo, Japan, and a ridged laser array device has been proposed by D. E. Ackley et al., Hewlett Packard Laboratories, Appln. Phys. Letters, 42(2), 15, p. 152, January 1983. Both of these laser array devices have the disadvantage that laser light at the region between the adjacent laser operation areas is absorbed into the electrode to a great extent due to the built-in structure thereof for constituting the index guided laser array, resulting in a 180° phase shift between the adjacent laser operation areas.

Thus, conventional semiconductor laser arrays cannot attain stabilized oscillation with a 0° phase shift between the adjacent laser operation areas, but they can attain the stabilized oscillation only with a 180° phase shift therebetween. Moreover, laser beams are emitted from the facet of the laser array device at a certain angle in each of the two different directions with respect to a direction which is vertical to the surface of the facet, so that the laser oscillation produced by these conventional laser array devices cannot be utilized in various instruments although it has a high output power.

SUMMARY OF THE INVENTION

The semiconductor laser apparatus of this invention which overcomes the above-discussed and numerous other disadvantages and deficiencies of the prior art, comprises a semiconductor laser array device in which a plurality of laser operation areas are disposed in a parallel manner to attain optical phase coupling therebetween and laser beams are propagated with a 180° phase shift therebetween in the adjacent laser operation areas, resulting in a far-field pattern having a peak in each of the two different directions of the emission of the laser beam therefrom, and a stem containing the semiconductor laser array device therein in such a manner that one of the laser beams from the semiconductor laser array device is blocked with the inner wall of the stem and the other laser beam passes outside of the stem.

The laser light blocked with the inner wall of the stem irradiates, in a preferred embodiment, a light detector, resulting in a detection signal corresponding to the output power intensity of the laser beam.

The stem comprises, in a preferred embodiment, a sloped table for supporting the semiconductor laser array device thereon, a portion of the inner wall thereof for blocking one of the laser beams from said semiconductor laser array device, a window for allowing passage of the other laser beam therethrough, and a light detector for providing the detection signal for a laser driving control circuit which supplies electric current to the semiconductor laser array device.

Thus, the invention described herein makes possible the objects of (1) providing a semiconductor laser apparatus which utilizes high output power characteristics of a semiconductor laser array device having a plurality of laser operation areas with a 180° phase shift between the adjacent laser operation areas thereby attaining stabilized laser oscillation; and (2) providing a semiconductor laser apparatus which produces a stabilized light source by the use of the above-mentioned semiconductor laser array device.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
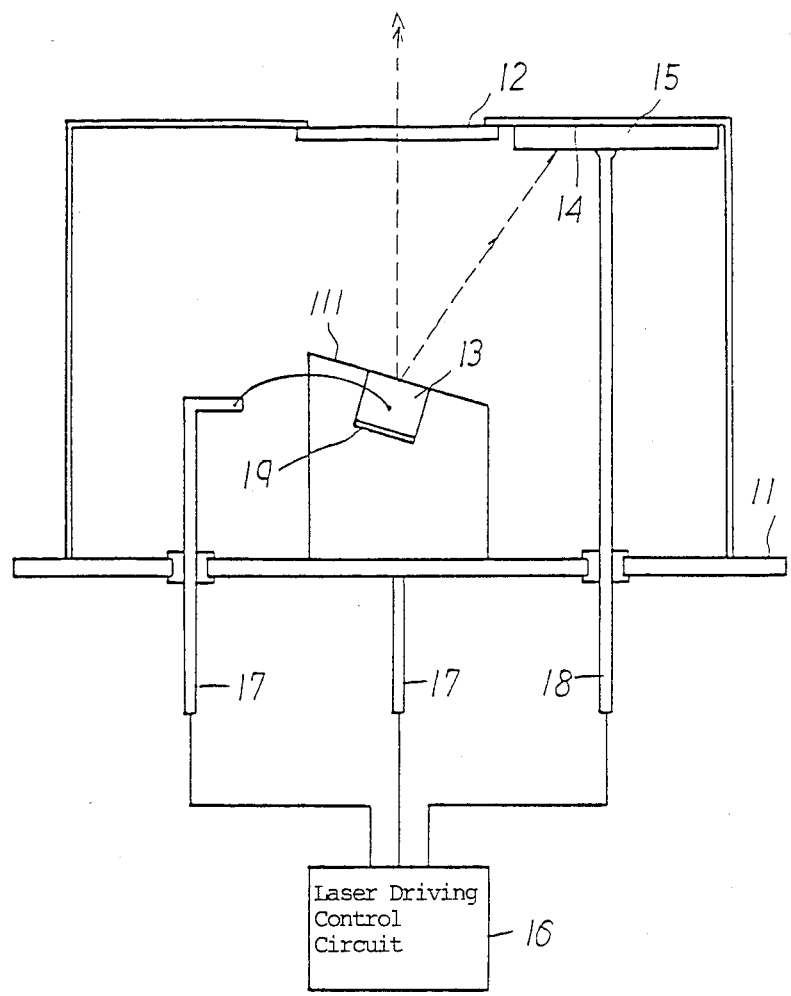
FIG. 1 is a schematic illustration showing the semiconductor laser apparatus of this invention.
Figure 2:
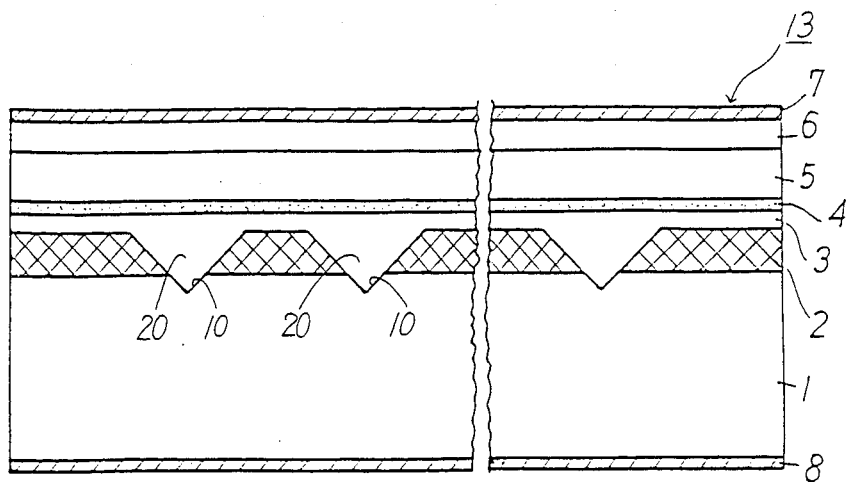
FIG. 2 is a sectional view showing the semiconductor laser array device used in the semiconductor laser apparatus shown in FIG. 1.

FIG. 2 shows a semiconductor laser array device 13 having a plurality of laser operation areas which attain optical phase coupling therebetween with a 180° phase shift. The semiconductor laser array device 13 which is used in a semiconductor laser apparatus of this invention shown in FIG. 1 is produced as follows:

On a p-GaAs substrate 1, an n-GaAs current blocking layer 2 is grown by liquid phase epitaxy. Then, a plurality of V-channels 20 are formed in a parallel manner on the side of the current blocking layer 2 by photolithography and an etching technique in such a manner that they reach the GaAs substrate 1 to form electric current paths 10 therein. Then, on the current blocking layer 2 containing the V-channels 20, a p-GaAlAs cladding layer 3, a p- (or n-) GaAs (or GaAlAs) active layer 4, an n-GaAlAs cladding layer 5 and an n-GaAs cap layer 6 are successively grown by liquid phase epitaxy, resulting in a multiple crystal structure of a double heterostructure type for laser oscillation. An n-side electrode 7 and a p-side electrode 8 are then formed on the upper face of the n-GaAs cap layer 6 and the back face of the GaAs substrate 1 by a metal vacuum evaporation technique, resulting in a semiconductor laser array device in which a plurality of laser operation areas are formed in a parallel manner corresponding to the current paths 10.

When electric current is injected into the device 13 through the p-side electrode 8 and the n-side electrode 7, it flows into the current paths 10 so that the portions of the active layer 4 corresponding to the striped V-channels 20 containing the current paths 10 act as laser operation areas which attain laser oscillation. A far-field pattern attained by the semiconductor laser array device, in which the adjacent laser operation areas are optically coupled therebetween at a spacing of approximately several μm with a 180° phase shift, has, as shown in FIG. 3, a peak with a high optical intensity at each of two different positions, the rotation angles of which are symmetrical with regard to an axis which is perpendicular to the surface of the facet emitting the laser beams therefrom.

Thus, if the semiconductor laser array device is disposed within a stem by considering the emission direction of the laser beams against a perpendicular axis in such a manner that one of the laser beams emitted from the facet is blocked with the inner wall of the stem and the other laser beam alone is introduced into the outside area of the stem, a single laser beam will be obtained and excellent output power characteristics of the semiconductor laser array device will be effectively utilized.

Figure 3:
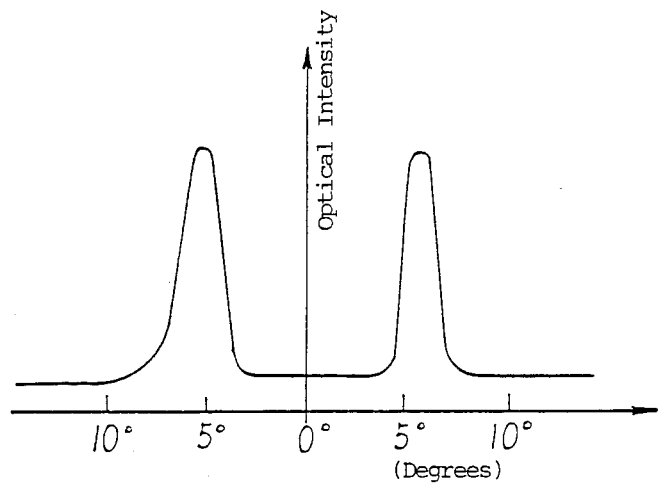
FIG. 3 is a diagram showing the far-field pattern attained by the semiconductor laser array device shown in FIG. 2.

The locations of the intensity peaks shown in FIG. 3 depend upon the pitch space Λ of the laser operation areas. The location angle θ of the two peaks of the laser beams against the axis which is perpendicular to the surface of the facet is roughly represented by the equation:

$$\theta = \pm \sin^{-1}(\lambda/2\Lambda)$$

wherein λ is an oscillation wavelength in the air.

FIG. 1 shows a semiconductor laser apparatus of this invention using the above-mentioned semiconductor laser array device 13. This apparatus comprises a stem 11 having a sloped table 111 on the bottom thereof and having a window 12 formed in the center portion of the upper wall thereof for allowing the passage of the laser beam therethrough; the semiconductor laser array device 13 disposed on the slope of the table 111 in such a manner that one of the laser beams emitted from the laser array device 13 can irradiate perpendicularly to the window 12; a light detector (e.g., a Si-photodiode) 15 disposed on the portion 14 of the upper wall of the stem 11 which is irradiated with the other laser beam; and a laser driving control circuit 16 disposed outside of the stem 11 for injecting electric current into the laser array device 13 through a terminal 17 on the bottom of the stem 11.

The slope of the table 111 can be calculated by the above-mentioned equation. The other laser beam irradiates the light detector 15 on the portion 14 of the upper wall of the stem 11, with which the laser beam is blocked to go outside of the stem 11.

The light detector 15 provides a detection signal corresponding to the irradiation intensity of the laser beam thereto for the laser driving control circuit 16 through a terminal 18 on the bottom of the stem 11. Since the laser beams emitted in the different directions from the facet of the laser array device 13 are proportional to each other, the optical intensity of the laser beam emitted outside through the window 12 can be determined by the optical intensity of the other laser beam irradiating the light detector 15. Thus, if the detection signal from the light detection 15 is compared with and distinguished from the reference signal prepared in advance, and electric current to be injected into the laser array device 13 is regulated in a manner to counteract variation in the detection signal, the laser beam emitted from the apparatus of this invention through the window 12 will be maintained at a certain level, resulting in a stabilized light source.

Since the semiconductor laser apparatus of this invention is designed as mentioned above, the output laser beam can be regulated by feedback from the detection signal from the light detector 15 to the driving circuit 16 which injects electric current into the laser array device 13. According to the structure of the apparatus mentioned above, the laser beam output power from the front facet alone of a pair of facets (i.e., the front facet and the back facet) of the laser array device 13 is utilized. In the case where the back facet is coated with a reflection film 19 having a reflection index of almost 100%, emission of the laser beam therefrom can be prevented so that a threshold current level of the laser array device 13 can be reduced and the unusable laser beam output power can be minimized.

The light detector 15 is disposed on the inner wall of the stem 11 in a manner to be directly irradiated with the laser beam from the laser array device 13, but it is not limited thereto. It can be disposed, as desired, to be irradiated with a reflected beam from a portion of the inner wall of the stem 11.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty which reside in the present invention, including all features which would be treated as equivalents thereof by those skilled in the art to which this invention pertains.

What is claimed is:

1. A semiconductor laser apparatus comprising:
   (1) a semiconductor laser array device including a plurality of laser operation areas disposed in a parallel manner so as to attain optical phase coupling therebetween, said laser operation areas being constructed to propagate first and second emitted laser beams in two different directions with a 180 degree phase shift therebetween from adjacent laser operation areas, said laser beams emitted from said adjacent operation areas exhibiting a far-field pattern having a peak in each of said two different directions; and
   (2) a stem structure containing said semiconductor laser array device therein, said stem structure including means for blocking said first emitted laser beam from said semiconductor laser array device and allowing said second emitted laser beam from said semiconductor laser array device to pass outside of said stem structure.

2. A semiconductor laser apparatus according to claim 1, wherein said stem structure comprises an inner wall for blocking said first emitted laser beam, said inner wall including a light detector disposed thereon for being irradiated by said first emitted laser beam and for producing a detection signal corresponding to the output power intensity of said first emitted laser beam.

3. A semiconductor laser apparatus according to claim 2, wherein said stem structure comprises a sloped table for supporting said semiconductor laser array device thereon and a window for allowing said second emitted laser beam to pass outside of said stem.

4. A semiconductor laser apparatus according to claim 3, wherein said light detector provides said detection signal for a laser driving control circuit operatively associated with said light detector and said semiconductor laser array device, said laser driving control circuit supplying electric current to said semiconductor laser array device.

5. A semiconductor laser apparatus according to claim 4, wherein said sloped table comprises an inclined surface of a pedestal.

6. A semiconductor laser apparatus according to claim 4, wherein said semiconductor laser array device further comprises a first facet for emitting said emitted laser beams disposed on a first surface of said semiconductor laser array device and a second facet disposed opposite to said first facet, said second facet being coated with a reflective film for preventing laser beam emission and for reducing the threshold current level of said semiconductor laser array device.

7. A semiconductor laser apparatus according to claim 4, wherein said light detector is disposed on said inner wall so as to be irradiated with a reflected laser beam.

8. A semiconductor laser apparatus according to claim 4, wherein electric current supplied to said semiconductor laser array device is regulated in a manner to counteract variation in said detection signal so as to provide a stabilized laser beam source.

9. A semiconductor laser apparatus according to claim 4, wherein said laser operation areas comprise portions of an active layer disposed within said semiconductor laser array device, said portions of said active layer corresponding to current paths disposed within V-channels, said V-channels being formed in a parallel manner within said semiconductor laser array device.

10. A semiconductor laser apparatus according to claim 9, wherein said light detector comprises a silicon-photodiode and said active layer comprises GaAs or GaAlAs.

* * * * *